United States Patent
Shin et al.

(10) Patent No.: US 12,400,975 B2
(45) Date of Patent: Aug. 26, 2025

(54) INTERCONNECT STRUCTURE AND ELECTRONIC DEVICE INCLUDING THE SAME

(71) Applicant: Samsung Electronics Co., Ltd., Suwon-si (KR)

(72) Inventors: Keunwook Shin, Yongin-si (KR); Junghoo Shin, Seoul (KR); Kyung-Eun Byun, Seongnam-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 390 days.

(21) Appl. No.: 17/549,026

(22) Filed: Dec. 13, 2021

(65) Prior Publication Data
US 2022/0415825 A1    Dec. 29, 2022

(30) Foreign Application Priority Data
Jun. 24, 2021    (KR) .................. 10-2021-0082332

(51) Int. Cl.
*H01L 23/00*    (2006.01)
*H01L 23/528*    (2006.01)
*H01L 23/532*    (2006.01)

(52) U.S. Cl.
CPC ........ *H01L 23/564* (2013.01); *H01L 23/5283* (2013.01); *H01L 23/53233* (2013.01);
(Continued)

(58) Field of Classification Search
None
See application file for complete search history.

(56) References Cited

U.S. PATENT DOCUMENTS 11,217,531 B2    1/2022    Byun et al.
11,682,622 B2    6/2023    Byun et al.
(Continued)

FOREIGN PATENT DOCUMENTS

JP    2004/253780 A    9/2004
KR    2015/0012251 A    2/2015
(Continued)

OTHER PUBLICATIONS

Juline Shoeb and Mark J. Kushner, "Damage by radicals and photons during plasma cleaning of porous low-k SiOCH. II. Water uptake and change in dielectric constant" *Journal of Vacuum Science and Technology A*, vol. 30, No. 4, 2012, pp. 041301-1-041301-8.
(Continued)

*Primary Examiner* — Dale E Page
*Assistant Examiner* — Derek L Nielsen
(74) *Attorney, Agent, or Firm* — HARNESS, DICKEY & PIERCE, P.L.C.

(57)    ABSTRACT

Provided are an interconnect structure and an electronic device including the same. The interconnect structure may include a conductive wiring having a certain pattern, a dielectric layer on side surfaces of the conductive wiring, a capping layer on the conductive wiring, and a graphene layer on the dielectric layer. The graphene layer may include a graphene material. A ratio of carbons having sp$^3$ bonds to carbons having sp$^2$ bonds in the graphene material is 1 or less.

22 Claims, 13 Drawing Sheets

(52) U.S. Cl.
CPC .. *H01L 23/53238* (2013.01); *H01L 23/53247* (2013.01); *H01L 23/53252* (2013.01); *H01L 23/53261* (2013.01); *H01L 23/53266* (2013.01)

(56) References Cited

U.S. PATENT DOCUMENTS

| | | |
|---|---|---|
| 2005/0179137 A1 | 8/2005 | Usami |
| 2012/0139114 A1 | 6/2012 | Zhang et al. |
| 2013/0299988 A1* | 11/2013 | Bonilla ............. H01L 23/53238 438/653 |
| 2015/0255184 A1* | 9/2015 | Li ........................ H01L 21/56 427/122 |
| 2016/0270237 A1 | 9/2016 | Cho et al. |
| 2018/0350913 A1* | 12/2018 | Yang .................. H01L 23/5226 |
| 2020/0035611 A1* | 1/2020 | Byun ................. H01L 23/53238 |
| 2020/0087150 A1* | 3/2020 | Wunch .................... C08L 75/00 |
| 2022/0399228 A1 | 12/2022 | Shin et al. |

FOREIGN PATENT DOCUMENTS

| | | |
|---|---|---|
| KR | 101633039 B1 | 6/2016 |
| KR | 2016/0130984 A | 11/2016 |
| KR | 2020/0011197 A | 2/2020 |

OTHER PUBLICATIONS

Korean Office Action dated Jun. 9, 2025 for corresponding Korean Patent Application No. 10-2021-0082332 and its English-language translation.

* cited by examiner

INTERCONNECT STRUCTURE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0082332, filed on Jun. 24, 2021, in the Korean Intellectual Property Office, the disclosure of which is incorporated by reference herein in its entirety.

BACKGROUND

1. Field

The present disclosure relates to an interconnect structure and an electronic device including the same.

2. Description of the Related Art

In recent years, the size of semiconductor devices has been gradually decreased for the high integration of semiconductor devices. To this end, the line width of a conductive wiring including a metal or a metal alloy in an interconnect structure may need to be reduced. When the line width of the conductive wiring is reduced, the current density in the conductive wiring increases, and as a result, the resistance of the conductive wiring increases. This increase in the resistance of the conductive wiring may cause electromigration of the atoms of the metal or the metal alloy constituting the conductive wiring, resulting in defects in the conductive wiring. Therefore, a capping layer capable of improving the resistance of the conductive wiring is needed.

In accordance with the miniaturization of semiconductor devices, the parasitic capacitance of a dielectric layer may be an important factor in improving the performance of wirings. The dielectric layer may include a low-dielectric constant (low-k) material and fine pores to adjust the dielectric constant. Moisture may permeate the fine pores in the dielectric layer from the outside, resulting in an increase in the dielectric constant, and thus, the effect of using the low-dielectric constant (low-k) material may be impaired.

SUMMARY

An aspect of example embodiments is to provide an interconnect structure in which a change in a dielectric constant of a dielectric layer is limited and/or prevented and the dielectric constant of the dielectric layer is maintained due to the hydrophobic surface characteristics of a graphene layer.

Another aspect is to provide an interconnect structure in which a capping layer is provided to reduce the resistance of a conductive wiring.

Still another aspect is to provide an electronic device including the interconnect structure.

Additional aspects will be set forth in part in the description that follows and, in part, will be apparent from the description, or may be learned by practice of the presented embodiments of the disclosure.

According to an embodiment, an interconnect structure may include a conductive wiring having a certain pattern, a dielectric layer on side surfaces of the conductive wiring, a capping layer on the conductive wiring, and a graphene layer on the dielectric layer. The graphene layer may include a graphene material, and a ratio of carbons having $sp^3$ bonds to carbons having $sp^2$ bonds in the graphene material may be 1 or less.

In some embodiments, the graphene layer may have a contact angle of about 80° to about 110°.

In some embodiments, the capping layer and the graphene layer may include different materials.

In some embodiments, the capping layer and the graphene layer may include a same material.

In some embodiments, the graphene layer may include about 1 atomic % to about 20 atomic % hydrogen.

In some embodiments, the graphene layer may further include one or more of F, Cl, Br, and N, and a content of the one or more of F, Cl, Br, and N may be in a range of about 1 atomic % to about 20 atomic %.

In some embodiments, an intensity ratio of a D-band peak to a G-band peak in a Raman spectrum of the graphene layer may be 3.5 or less.

In some embodiments, an intensity ratio of a 2D-band peak to a G-band peak in a Raman spectrum of the graphene layer may be 0.2 or greater.

In some embodiments, an average grain size of the graphene material may be about 0.5 nm to about 100 nm.

In some embodiments, a thickness of the graphene layer may be about 1 nm to about 20 nm.

In some embodiments, a density of the graphene layer may be about 1.6 g/cc to about 2.1 g/cc.

In some embodiments, the conductive wiring may include one or more of Cu, Ru, Rh, Ir, Mo, W, Pd, Pt, Co, Ta, and Ti, or an alloy thereof, or a subcombination thereof, or a combination thereof.

In some embodiments, the interconnect structure may further include a barrier layer between the dielectric layer and the conductive wiring.

In some embodiments, the interconnect structure may further include a liner layer between the conductive wiring and the barrier layer.

According to an embodiment, an electronic device may include a substrate, and an interconnect structure on the substrate. The interconnect structure may include a conductive wiring having a certain pattern, a dielectric layer on side surfaces of the conductive wiring, a capping layer on the conductive wiring, and a graphene layer on the dielectric layer. The graphene layer may include a graphene material. A ratio of carbons having $sp^3$ bonds to carbons having $sp^2$ bonds in the graphene material may be 1 or less.

In some embodiments, the graphene layer may have a contact angle of about 80° to about 110°.

In some embodiments, the capping layer and the graphene layer may include different materials.

In some embodiments, the capping layer and the graphene layer may include a same material.

In some embodiments, the graphene layer may include about 1 atomic % to about 20 atomic % hydrogen.

In some embodiments, the graphene layer may further include one or more of F, Cl, Br, and N, and a content of the one or more of F, Cl, Br, and N may be in a range of about 1 atomic % to about 20 atomic %.

In some embodiments, an intensity ratio of a D-band peak to a G-band peak in a Raman spectrum of the graphene layer may be 3.5 or less.

In some embodiments, an intensity ratio of a 2D-band peak to a G-band peak in a Raman spectrum of the graphene layer may be 0.2 or greater.

According to an embodiment, an interconnect structure may include a dielectric layer including a trench, a graphene layer on a first surface of the dielectric layer, a conductive wiring in the trench, and a capping layer on the conductive wiring. The trench may be recessed in a first direction from the first surface of the dielectric layer to a second surface of the dielectric layer. The trench may have a pattern. The graphene layer may define an opening over the trench. A ratio of carbons having $sp^3$ bonds to carbons having $sp^2$ bonds in the graphene layer may be 1 or less.

In some embodiments, the capping layer and the graphene layer may include different materials, and the capping layer may be in the opening defined by the graphene layer.

In some embodiments, the dielectric layer may include at least one of $Al_2O_3$, AlN, $ZrO_2$, $HfO_x$ (0<x<4), $SiO_2$, SiCO, SiCN, SiON, SiCOH, AlSiO, or boron nitride (BN). The graphene layer may be configured to limit impurities from entering the dielectric layer through the first surface of the dielectric layer.

In some embodiments, the graphene layer may further include one or more of F, Cl, Br, and N. A content of the one or more of F, Cl, Br, and N may be in a range of about 1 atomic % to about 20 atomic %.

In some embodiments, a barrier layer may be in the trench between the dielectric layer and the conductive wiring.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
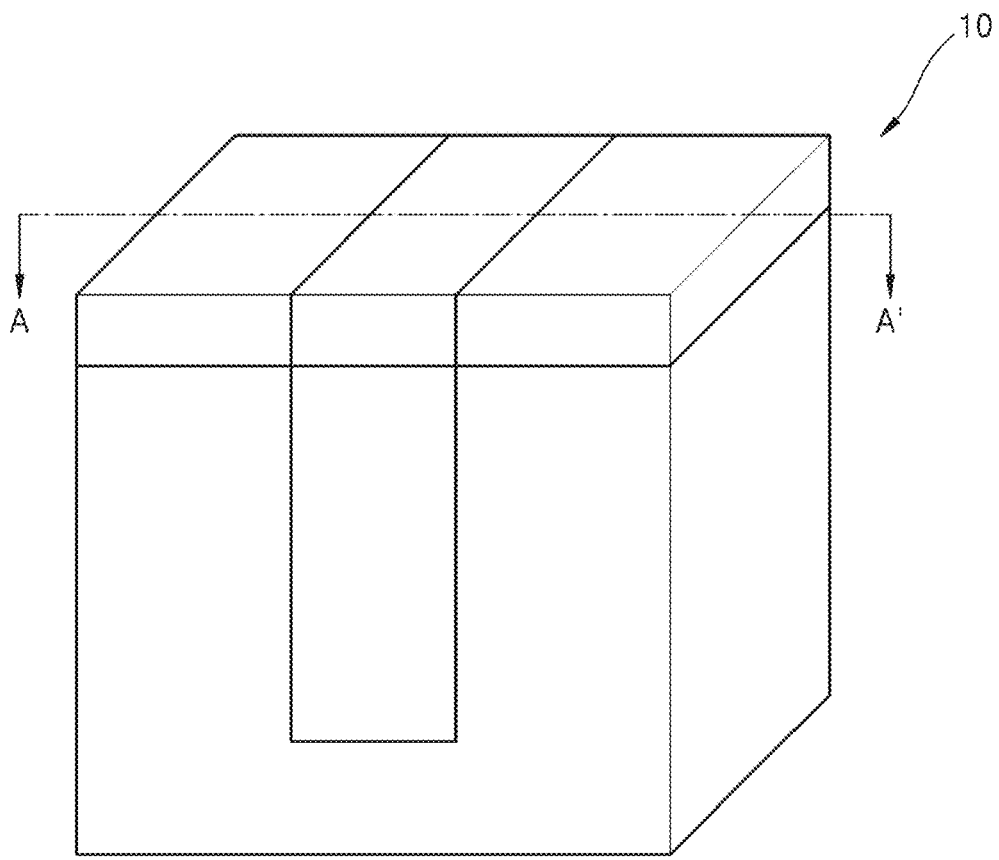
FIG. 1 is a perspective view of an interconnect structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, an interconnect structure according to an embodiment of the present disclosure, an electronic device including the interconnect structure, and a method of manufacturing the interconnect structure will be described in detail with reference to the accompanying drawings. The descriptions below are merely non-limiting examples, and the present disclosure is not limited thereto and is only defined by the scope of claims described below. In the drawings, like reference numerals denote like elements, and the size or thickness of each element may be exaggerated for clarity and convenience of description.

As used herein, the term "combination" includes a mixture, an alloy, a reaction product, or a composite form with an element unless otherwise stated. Throughout the present specification, when an element "includes" an element, unless there is a particular description contrary thereto, the element may further include other elements, not excluding the other elements. An expression used in the singular encompasses the expression of the plural, unless otherwise indicated or it has a clearly different meaning in the context. The term "or" refers to "and/or" unless otherwise stated.

As used herein, the terms "an embodiment", "embodiments", and the like indicate that elements described with regard to an embodiment are included in at least one embodiment described in this specification and may or may not present in other embodiments. In addition, it should be understood that the described elements may be combined in any suitable manner in various embodiments. When an element is referred to as being "on" another element, it may be directly on the other element or intervening elements may be present therebetween. Unless otherwise defined, technical and scientific terms used herein have the same meaning as commonly understood by one of ordinary skill in the art to which this application belongs. All patents, patent applications, and other references cited herein are incorporated herein by reference in their entirety. However, in the event of any conflict or inconsistency between terms used herein and terms of the cited references, the terms used in this specification take precedence over the terms of the cited references.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While particular embodiments are described, alternatives, modifications, variations, improvements, and substantial equivalents that are or may be presently unforeseen may arise to applicants or those of ordinary skill in the art. Accordingly, the appended claims as filed and as they may be amended are intended to embrace all such alternatives, modification, variations, improvements, and substantial equivalents.

The term "graphene" used herein refers to a sheet structure of a single atomic layer formed by a carbon nanostructure that forms polycyclic aromatic molecules in which a plurality of carbon atoms are covalently bound and aligned in a planar shape; a network structure in which a plurality of carbon nanostructures as a small film having a plate shape are interconnected and aligned in a planar shape; or a combination thereof. The covalently bound carbon atoms may form 6-membered rings as repeating units, but may further include 5-membered rings and/or 7-membered rings. The graphene may be formed by stacking a plurality of layers including several sheet structures and/or network structures, and the average thickness may be about 100 nm or less, for example, about 10 nm or less, specifically, about 0.01 nm to about 10 nm.

Figure 2:
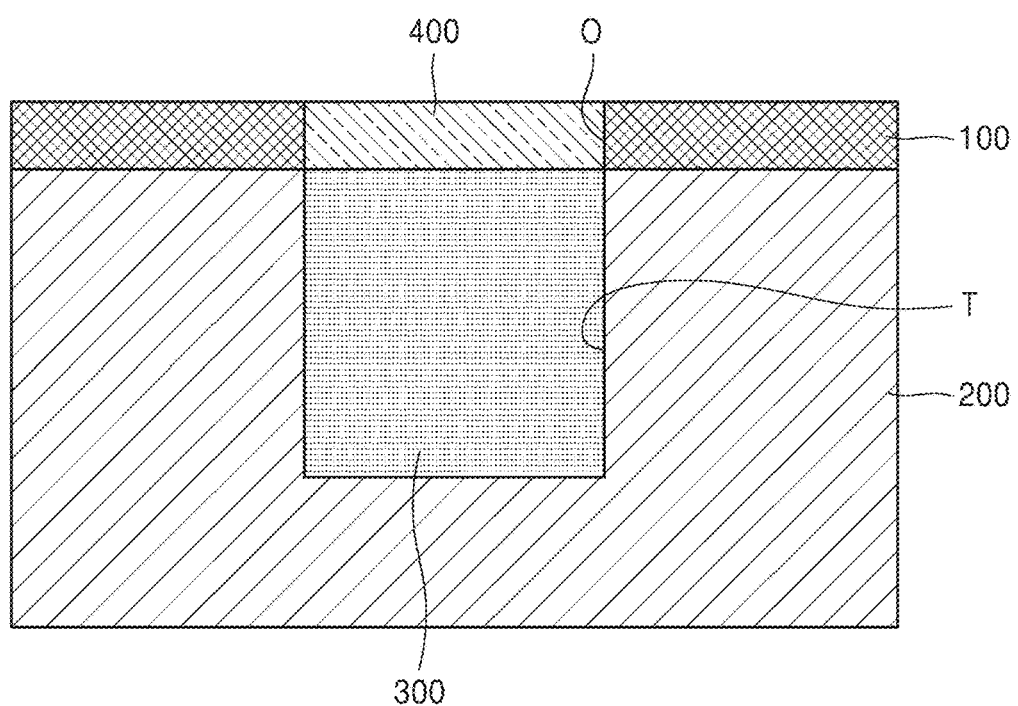
FIG. 2 is a cross-sectional view of the interconnect structure illustrated in FIG. 1, taken along line A-A'.

FIG. 1 is a perspective view of an interconnect structure 10 according to an embodiment. FIG. 2 is a cross-sectional view of the interconnect structure 10 illustrated in FIG. 1, taken along line A-A'.

Referring to FIGS. 1 and 2, the interconnect structure 10 according to an embodiment may include a graphene layer 100 on a dielectric layer 200, a conductive wiring 300, and a capping layer 400. The dielectric layer 200 may be on side surfaces of a conductive wiring 300. The conductive wiring 300 may have a certain pattern. The capping layer 400 may be on the conductive wiring 300.

The dielectric layer may define a trench T that may be recessed from a first surface (e.g., upper surface) of the dielectric layer 200 to a second surface (e.g., bottom surface of trench T) of the dielectric layer 200. The graphene layer 100 may be on the first surface of the dielectric layer 200 and may define an opening O over the trench O. The capping layer 400 may be in the opening O defined by the graphene layer 100.

The graphene layer 100 according to an embodiment may include a graphene material, and the ratio of carbons having $sp^3$ bonds to carbons having $sp^2$ bonds in the graphene material may be 1 or less. The graphene layer 100 may be on the dielectric layer 200 to limit and/or block permeation of impurities, for example, moisture, etc., into the dielectric layer 200. A technical feature of protecting the dielectric layer 200 by using the graphene layer 100 will be described below with reference to FIGS. 3A to 6C.

The dielectric layer 200 may have a single-layer structure or a multi-layer structure in which different materials are stacked. The dielectric layer 200 according to an embodiment may include a dielectric material that is used in a general semiconductor manufacturing process. In accordance with the miniaturization of semiconductor devices, the parasitic capacitance of the dielectric layer 200 may be an important factor in improving the performance of wirings. Accordingly, the dielectric layer 200 may include a low-dielectric constant (low-k) material as an inter-metal dielectric (IMD). The dielectric layer 200 according to an embodiment may include pores for dielectric constant adjustment.

For example, the dielectric layer 200 may include a dielectric material having a dielectric constant of about 3.6 or less, for example, about 3.3 or less, for example, about 3.0 or less. For example, the dielectric layer 200 may include at least one of $Al_2O_3$, AlN, $ZrO_2$, $HfO_x$ (0<x<4), $SiO_2$, SiCO, SiCN, SiON, SiCOH, AlSiO, or boron nitride (BN). However, the present disclosure is not limited thereto, and various other dielectric materials may be used in the dielectric layer 200. In addition, the dielectric layer 200 may include an organic dielectric material.

The conductive wiring 300 may include a metal or a metal alloy having excellent electrical conductivity. The conductive wiring 300 may include one or more metals selected from Cu, Ru, Rh, Ir, Mo, W, Pd, Pt, Co, Ta, and Ti, or an alloy thereof, or a subcombination thereof, or a combination thereof. In accordance with the miniaturization of semiconductor devices, the conductive wiring 300 may have a nano-scale line width, but is not limited thereto. For example, the dielectric layer 200 may be on side surfaces or the bottom surface of the conductive wiring 300, but not on the conductive wiring 300. Throughout the present specification, regions in which the dielectric layer 200 may be provided, e.g., those on the side surfaces or the bottom surface of the conductive wiring 300, are defined as regions excluding a region on the top surface of the conductive wiring 300 in which the capping layer 400 may be provided.

The capping layer 400 may be on the conductive wiring 300 to reduce the electrical resistance of the conductive wiring 300, thereby improving the electromigration resistance. The capping layer 400 may include a material different from that of the graphene layer 100. For example, the capping layer 400 may include a conductive material such as cobalt or tungsten.

For example, in the case where the capping layer 400 formed of cobalt (Co) is on the conductive wiring 300 composed of copper wires, the electrical resistance of the conductive wiring 300 may be reduced by about 4% or more, compared to the case where the capping layer 400 is not provided on the conductive wiring 300.

As described above, the dielectric layer 200 may include the fine pores to adjust the dielectric constant. Impurities, for example, moisture, etc., may permeate the fine pores included in the dielectric layer 200 from the outside. This results in an increase in the dielectric constant of the dielectric layer 200, and thus the effect of using the low-dielectric constant (low-k) material may be impaired. Hereinafter, the graphene layer 100, which may be on the dielectric layer 200 to limit and/or block permeation of impurities, for example, moisture, etc., into the dielectric layer 200, will be described.

Figure 4:
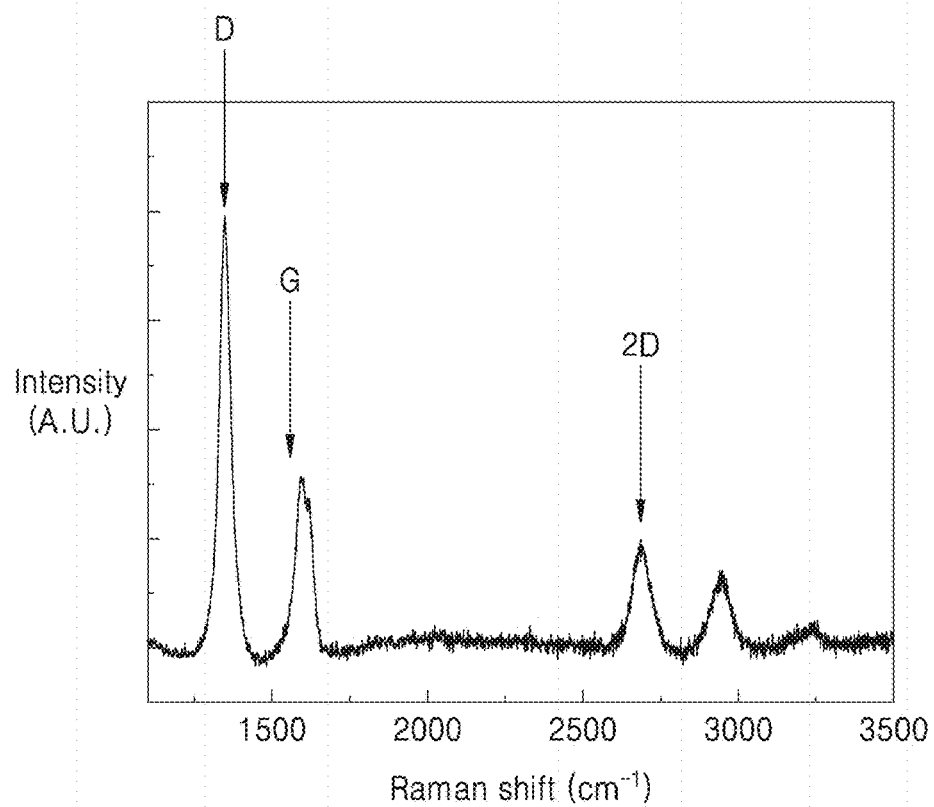
FIG. 4 is a diagram illustrating a Raman spectroscopic spectrum analysis result with respect to a graphene layer, according to an embodiment.
Figure 5:
FIG. 5 is a transmission electron microscopic (TEM) image of an interconnect structure according to an embodiment.
Figure 6A:
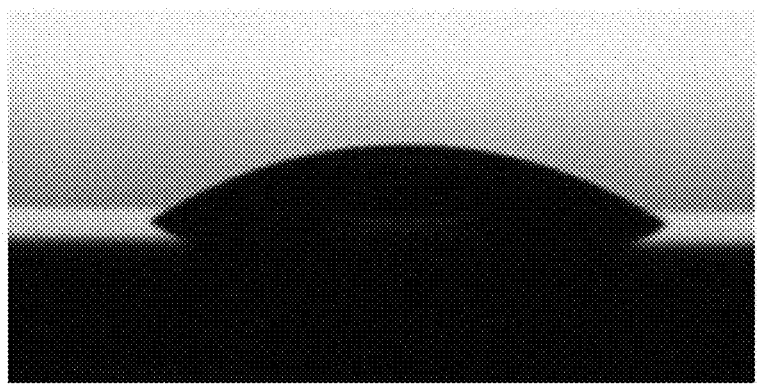
FIG. 6A is a picture of a dielectric layer with moisture thereon, according to a comparative example.
Figure 6B:
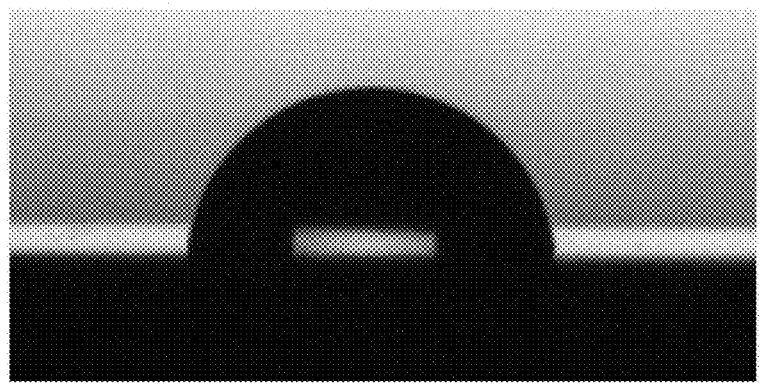
FIG. 6B is a picture of a graphene layer with moisture thereon, according to an embodiment.
Figure 6C:
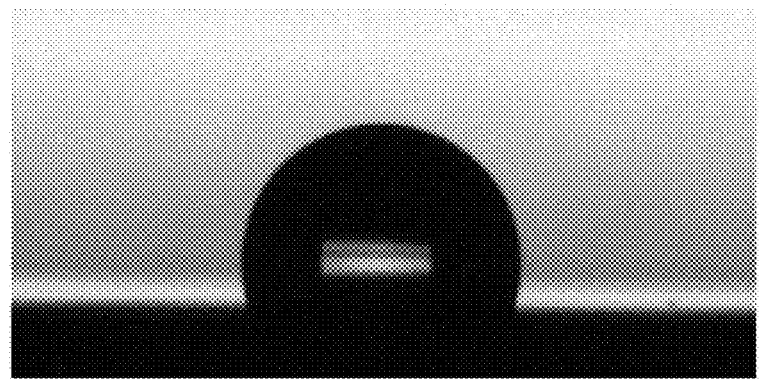
FIG. 6C is a picture of a graphene layer including fluorine with moisture thereon, according to another embodiment.

FIGS. 3A to 3D are schematic diagrams illustrating a method of manufacturing a graphene layer, according to an embodiment. FIG. 3E is a diagram illustrating an X-ray photoelectron spectroscopic (XPS) analysis result on a graphene layer, according to an embodiment. FIG. 4 is a diagram illustrating a Raman spectroscopic spectrum analysis result on a graphene layer, according to an embodiment. FIG. 5 is a transmission electron microscopic (TEM) image of an interconnect structure according to an embodiment. FIG. 6A is a picture of a dielectric layer with moisture thereon, according to a comparative example. FIG. 6B is a picture of a graphene layer with moisture thereon, according to an embodiment. FIG. 6C is a picture of a graphene layer including fluorine with moisture thereon, according to another embodiment.

The graphene layer 100 according to an embodiment may be grown on the surface of the dielectric layer 200 by atomic layer deposition (ALD), chemical vapor deposition (CVD), or plasma-enhanced CVD (PECVD). In the present embodiment, the graphene layer 100 may not be formed on the surface of the conductive wiring 300, but may be formed only on the surface of the dielectric layer 200. Hereinafter, a method of forming the graphene layer 100 on the dielectric layer 200 by performing PECVD described above will be described with reference to FIGS. 3A to 3D.

Figure 3A:
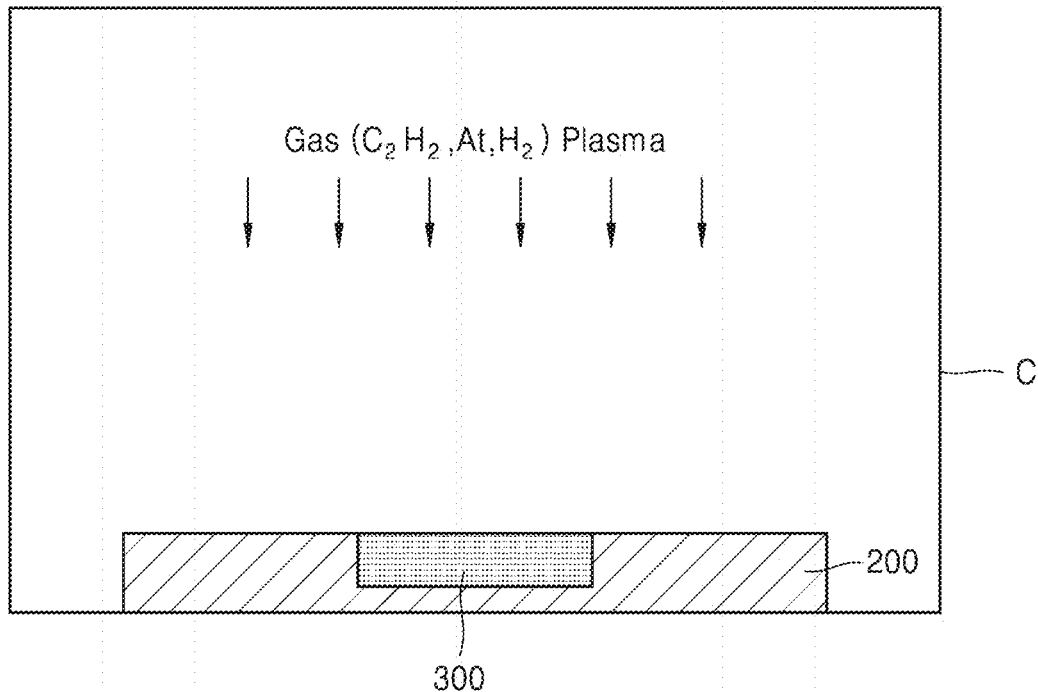
FIGS. 3A to 3D are schematic diagrams illustrating a method of manufacturing a graphene layer, according to an embodiment.

Referring to FIG. 3A, power for plasma generation is applied into a reaction chamber C, in which the dielectric layer 200 and the conductive wiring 300 are provided, and a reaction gas for growing the graphene layer 100 is injected into the reaction chamber.

Then, power for plasma generation is applied from a plasma power source (not shown) into the reaction chamber C. Here, the power for plasma generation may be about 10 W to about 3000 W. However, the present disclosure is not limited thereto.

For example, a radio frequency (RF) power source or a microwave (MW) power source may be used as the plasma power source.

When the power for plasma generation is applied to the reaction chamber C from the plasma power source, an electric field may be induced in the reaction chamber C. In such a state in which the electric field is induced, the reaction gas for growing the graphene layer 100 is injected into the reaction chamber C.

A mixed gas of a carbon source gas, an inert gas, and a hydrogen gas may be used as the reaction gas for growing the graphene layer 100. The carbon source gas may be a gas which supplies carbon for growth of nanocrystalline graphene. For example, the carbon source gas may include at least one of a hydrocarbon gas and a vapor of a liquid precursor including carbon. The hydrocarbon gas may include, for example, at least one of methane gas, ethylene gas, and propylene gas, but is not limited thereto. In addition, the liquid precursor may include, for example, at least one of toluene, benzene, anisole, and ethanol, but is not limited thereto. The inert gas may include, for example, at least one of argon gas, nitrogen gas, helium gas, krypton gas, and xenon gas. FIG. 3A illustrates a case where the carbon source gas is acetylene gas, and the inert gas is argon gas.

The process temperature for growing the graphene layer 100 may be about 500° C. or less, which is less than a temperature used in a general chemical vapor deposition process. For example, the process temperature inside the reaction chamber may be about 200° C. to about 500° C.

In addition, the process pressure for growing the graphene layer 100 may be about 0.01 Torr to about 1 Torr. However, this is merely a non-limiting example, and other process pressures may be used.

When the reaction gas in which the carbon source gas, the inert gas, and the hydrogen gas are mixed is introduced into the reaction chamber C, the reaction gas is converted into a plasma state by an electric field applied by plasma power.

Figure 3B:
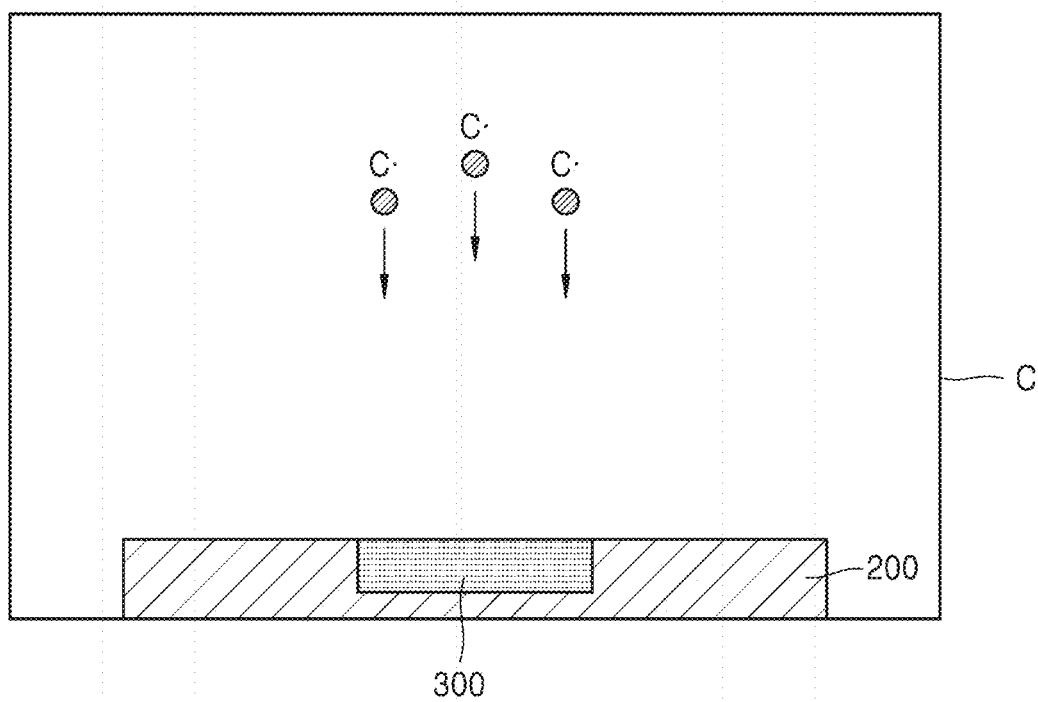
Figure 3C:
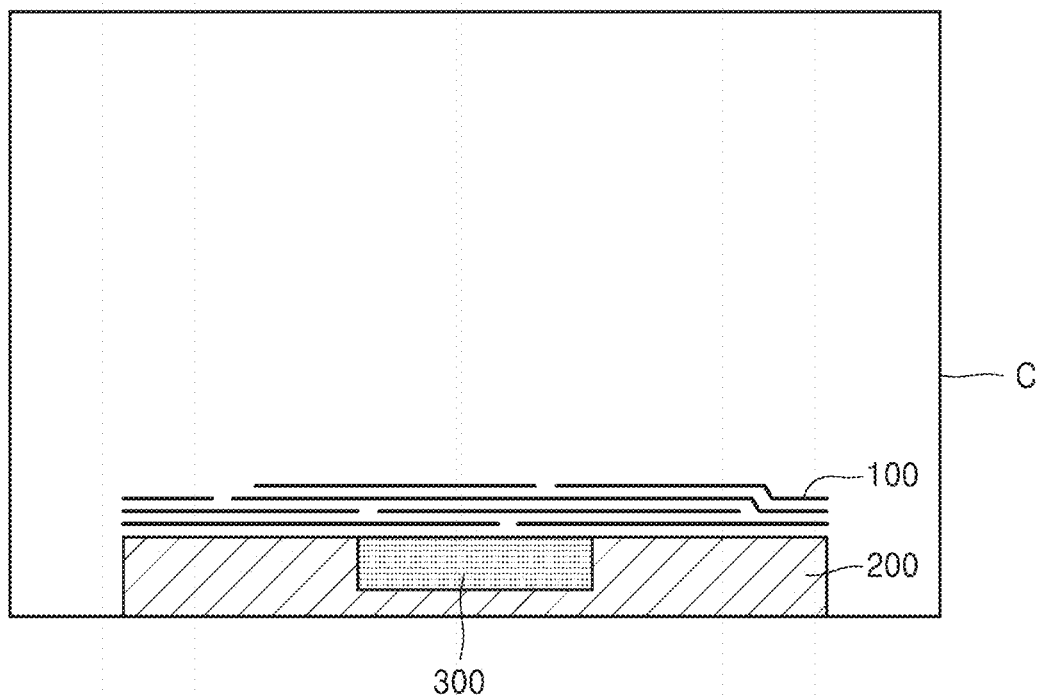

Referring to FIG. 3B, active carbon radicals C. are produced by plasma of the reaction gas in which the carbon source gas, the inert gas, and the hydrogen gas are mixed, and are adsorbed onto the surface of the dielectric layer 200. Specifically, plasma of the inert gas in the reaction gas produces the active carbon radicals C. from the carbon source gas, the produced active carbon radicals C. are adsorbed onto the surfaces of the dielectric layer 200 and the conductive wiring 300 as illustrated in FIG. 3C, and thus the graphene layer 100 is grown within a short period of time.

Figure 3D:
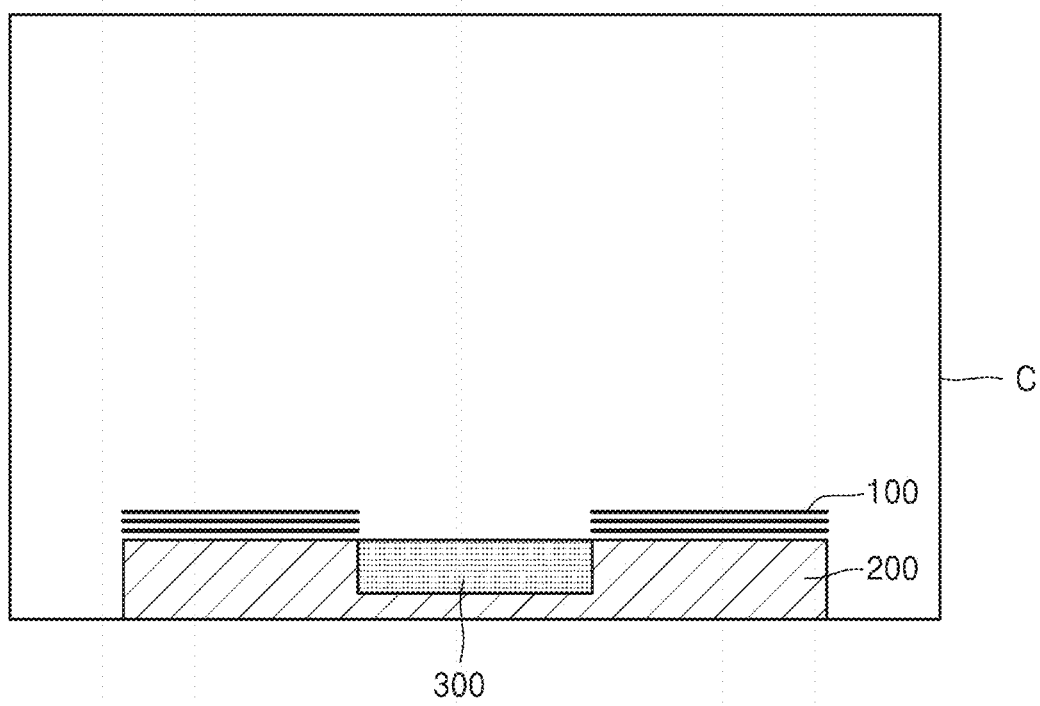
Figure 3E:
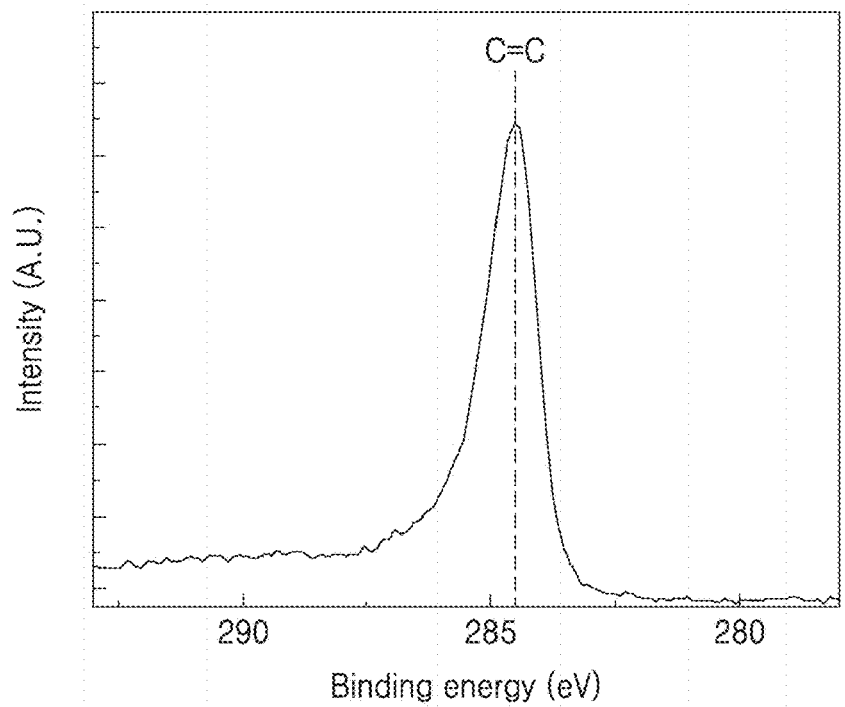
FIG. 3E is a diagram illustrating an X-ray photoelectron spectroscopic (XPS) analysis result with respect to a graphene layer, according to an embodiment.

Referring to FIG. 3D, a portion of the graphene layer 100 on the conductive wiring 300 may be removed by performing an etching process, to form the graphene layer 100 only on the dielectric layer 200.

The graphene material included in the graphene layer 100 according to an embodiment may include an edge carbon (edge C) that exists at an edge site and a center carbon (center C) that exists at a center site. The edge carbon has a $sp^3$ bonding structure, and the center carbon has a $sp^2$ bonding structure. The $sp^3$ bonding structure is a three-dimensional bonding structure of a regular tetrahedron of carbons such as diamond, and the $sp^2$ bonding structure is a two-dimensional bonding structure of graphite. Because a functional group such as oxygen or nitrogen may be bound to the edge carbon, the edge carbon may have a higher reactivity to an etching solution compared to the center carbon. The ratio of carbons having $sp^3$ bonds to carbons having $sp^2$ bonds in the graphene material may be 1 or less.

The graphene layer 100, in which the amount of carbons having $sp^2$ bonds is larger than the amount of carbons having $sp^3$ bonds, may have a higher contact angle than that of the dielectric layer 200. For example, the surface of the graphene layer 100, having a ratio of carbons having $sp^3$ bonds to carbons having $sp^2$ bonds of 1 or less, may have a high contact angle of about 80° to about 110°. However, the present disclosure is not limited thereto. The term 'contact angle' used herein refers to the water contact angle (WCA) of a surface. The water contact angle refers to the angle of contact between a drop of water and an air-liquid-solid interface.

According to an experimental result on the contact angle, as shown in FIG. 6A, the contact angle of the dielectric layer 200 was measured to be approximately 34.8°. In this regard, as shown in FIG. 6B, the contact angle of the graphene layer 100 was measured to be approximately 90.6°.

The fact that the graphene layer 100 in which the amount of carbons having $sp^2$ bonds is larger than the amount of carbons having $sp^3$ bonds has a higher contact angle than that of the dielectric layer 200 means that the graphene layer 100 has a stable surface having lower surface energy than that of the dielectric layer 200. Accordingly, the graphene layer 100 on the dielectric layer 200 may protect the dielectric layer 200 from permeation of impurities from the outside, for example, moisture, etc., into the dielectric layer 200. Accordingly, the dielectric constant of the dielectric layer 200 may be limited and/or prevented from being increased, and thus degradation of the electrical characteristics of the interconnect structure may be limited and/or prevented.

The graphene layer 100 may further include atoms having high electronegativity to further reduce the surface energy. For example, F, Cl, Br, N, P, or O atoms may be additionally included in the graphene layer 100 through surface treatment of the graphene layer 100. In this case, the graphene layer 100 may have a higher contact angle than when the above-described atoms are not added. For example, as shown in FIG. 6C, the contact angle of the graphene layer 100 including F atoms was measured to be approximately 102.1°.

The ratio of carbons having a $sp^2$ bonding structure to total carbons may be confirmed by performing XPS analysis. The XPS analysis was performed by using Quantum 2000 (Physical Electronics) (acceleration voltage: 0.5 keV to 15 keV, 300 W, energy resolution: about 1.0 eV, sputter rate: 0.1 nm/min). The result of Raman analysis, as illustrated in FIG. 3E, shows that a graphene material having an $sp^2$ bonding structure predominates in the graphene layer 100 according to an embodiment. From this, it may be seen that the ratio of carbons having $sp^3$ bonds to carbons having $sp^2$ bonds in the graphene layer 100 is 1 or less.

The average grain size of the graphene material of the graphene layer 100 according to an embodiment may be 0.5 nm or more and 100 nm or less. Here, the average grain size refers to D50, and indicates the grain size when the graphene material in which grains with various sizes are distributed is accumulated up to 50% by volume. Here, the average grain size may be an average particle diameter when the graphene material is spherical, and may be the length of the long axis when the graphene material is not spherical (e.g., oval or rectangular).

In addition, the thickness of the graphene layer 100 according to an embodiment may be about 1 nm to about 20 nm. For example, the thickness of the graphene layer 100 may be about 1 nm to about 10 nm, about 1 nm to about 5 nm, or about 1 nm to about 3 nm. Here, the graphene layer 100 may have a density of about 1.6 g/cc to about 2.1 g/cc. The graphene material has a stable structure when the thickness and density of the graphene layer 100 are in the respective ranges described above.

Referring to FIG. 4, the graphene layer 100 according to an embodiment exhibits peaks at about 1340 $cm^{-1}$ to about 1350 $cm^{-1}$, about 1580 $cm^{-1}$, and about 2700 $cm^{-1}$ in the Raman spectrum. These peaks provide information of a thickness, a crystallinity, and a charge doping status of the graphene material. The peak observed at about 1580 $cm^{-1}$ is a "G-band" peak, which is generated in a vibration band corresponding to stretching of a carbon-carbon bond, and the energy of the "G-band" is determined according to the density of an excess of charges doped in the graphene material. The peak observed at about 1340 $cm^{-1}$ to about 1350 $cm^{-1}$ is a "D-band" peak, which appears when a $sp^2$ crystal structure has defects and which is mainly observed when many defects are in a sample or around edges of the sample. The peak observed at about 2700 $cm^{-1}$ is a "2D-band" peak which is useful in evaluating the thickness of the graphene material.

The graphene layer 100 may have an intensity ratio of the D-band peak to the G-band peak of about 3.5 or less in the Raman spectrum.

The graphene layer 100 may have an intensity ratio of the 2D-band peak to the G-band peak of about 0.2 or greater in the Raman spectrum.

The graphene layer 100 may include hydrogen in an amount of about 1 atomic % to about 20 atomic %. The amounts of carbon and hydrogen may be confirmed by, for example, XPS analysis and Rutherford backscattering spectroscopic (RBS) component analysis. As described above, the graphene layer 100 may further include atoms having high electronegativity, for example, F, Cl, Br, N, P, or O atoms, to further reduce the surface energy. The concentration of atoms added to the graphene layer 100 may be about 1 atomic % to about 20 atomic %, but is not limited thereto.

Figure 7A:
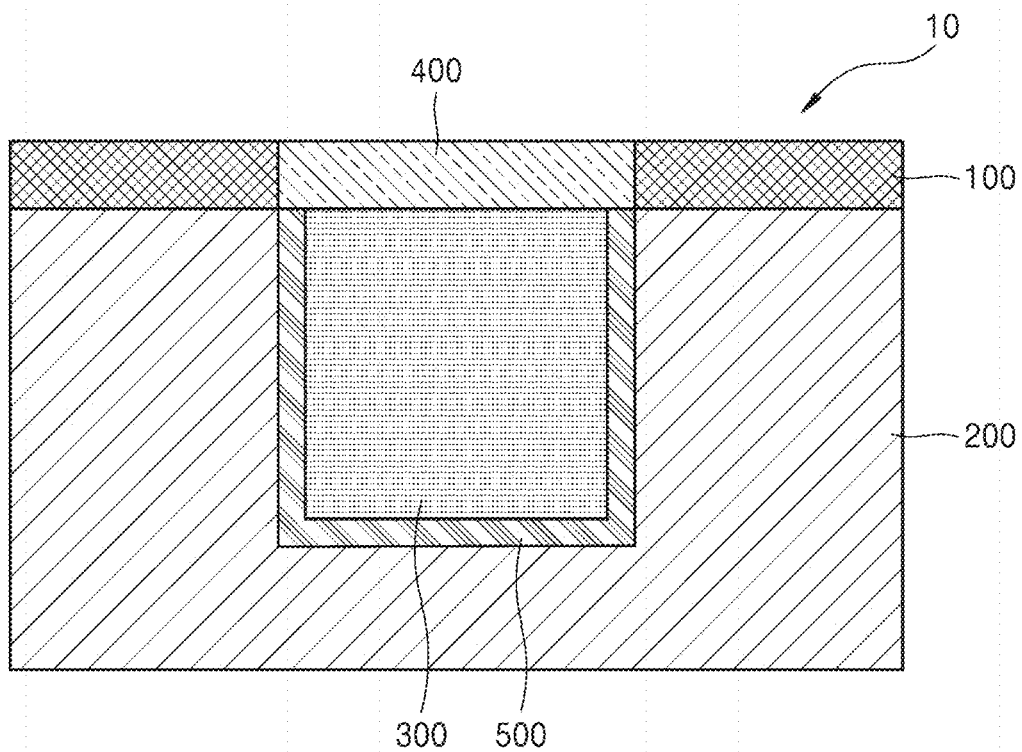
FIG. 7A is a cross-sectional view of an interconnect structure according to another embodiment.
Figure 7B:
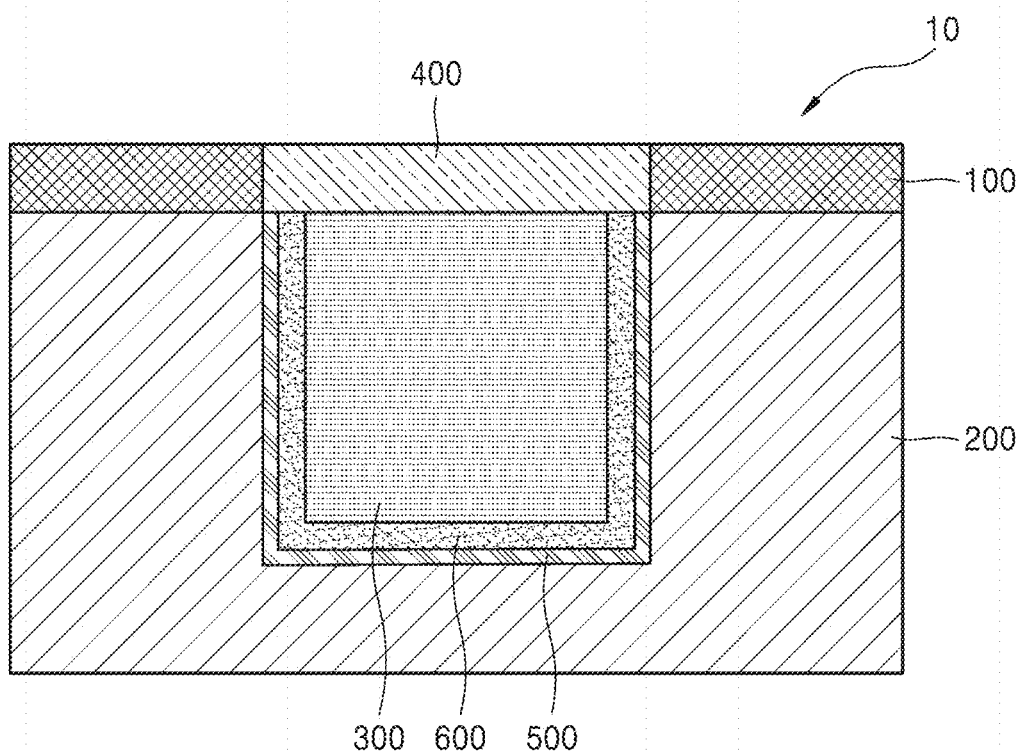
FIG. 7B is a cross-sectional view of an interconnect structure according to another embodiment.

FIG. 7A is a cross-sectional view of the interconnect structure 10 according to another embodiment. FIG. 7B is a cross-sectional view of the interconnect structure 10 according to another embodiment.

Referring to FIG. 7A, the interconnect structure 10 according to an embodiment may further include a barrier layer 500 between the dielectric layer 200 and the conductive wiring 300. The barrier layer 500 according to an embodiment may be formed by performing a deposition process including CVD, PECVD, physical vapor deposition (PVD), ALD, sputtering, and/or plating, which are used in a general semiconductor manufacturing process. For example, the barrier layer 500 may include a metal, an alloy of a metal, a metal nitride, or the like. For example, the barrier layer 500 may include a conductive material such as Ti, Ta, Ru, W, Ir, RuTa, IrTa, TiN, TaN, RuN, RuTaN, IrTaN, WN, or graphene. However, the present disclosure is not limited thereto. The barrier layer 500 may have a single-layer structure or a multi-layer structure in which different materials are stacked. The thickness of the barrier layer 500 may be changed according to a material used as well as the deposition process. For example, the thickness of the barrier layer 500 may be about 1 nm to about 40 nm.

Referring to FIG. 7B, the interconnect structure 10 according to an embodiment may further include a liner layer 600 between the conductive wiring 300 and the barrier layer 500. The liner layer 600 according to an embodiment may be formed by performing a deposition process including CVD, PECVD, PVD, ALD, sputtering, and plating, which are used in a general semiconductor manufacturing process. For example, the liner layer 600 may include a metal, an alloy of a metal, a metal nitride, or the like. For example, the liner layer 600 may include Ta, Ti, Co, TaN, Ti(Si)N, or W. However, the present disclosure is not limited thereto. The liner layer 600 may have a single-layer structure or a multi-layer structure in which different materials are stacked. The thickness of the liner layer 600 may be changed according to a material used as well as the deposition process. For example, the thickness of the liner layer 600 may be about 1 nm to about 40 nm. The liner layer 600 may include a different material than the barrier layer 500.

Figure 8:
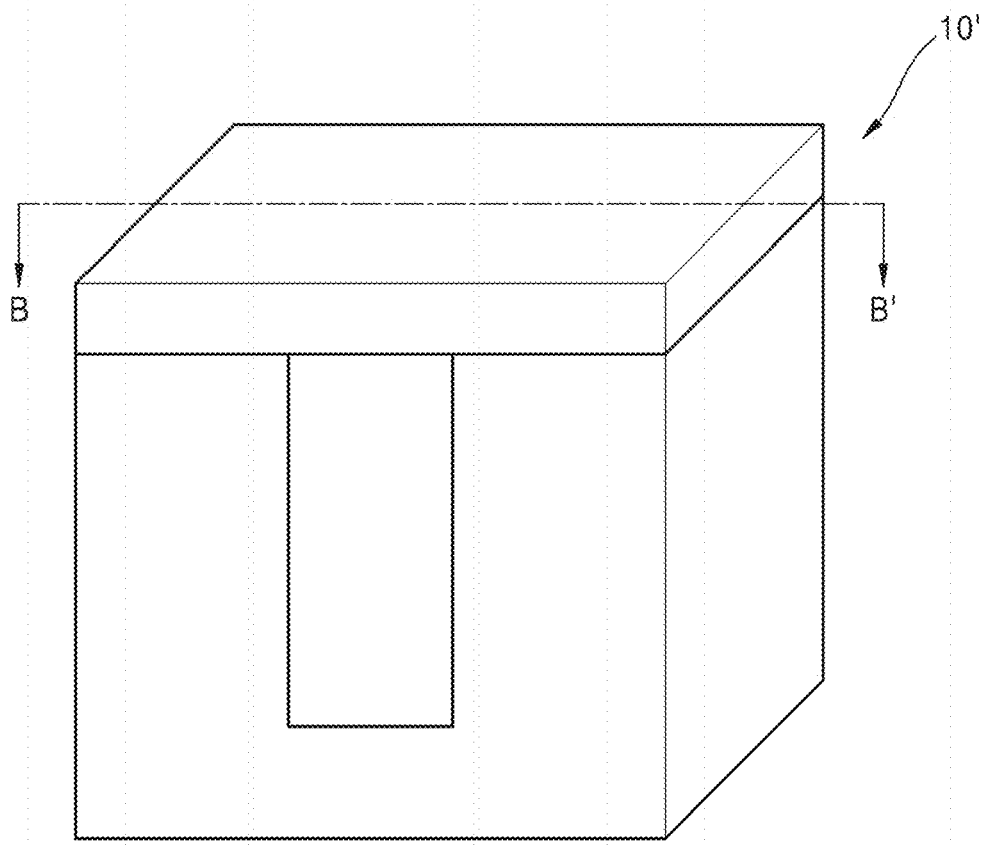
FIG. 8 is a perspective view of an interconnect structure according to an embodiment.
Figure 9:
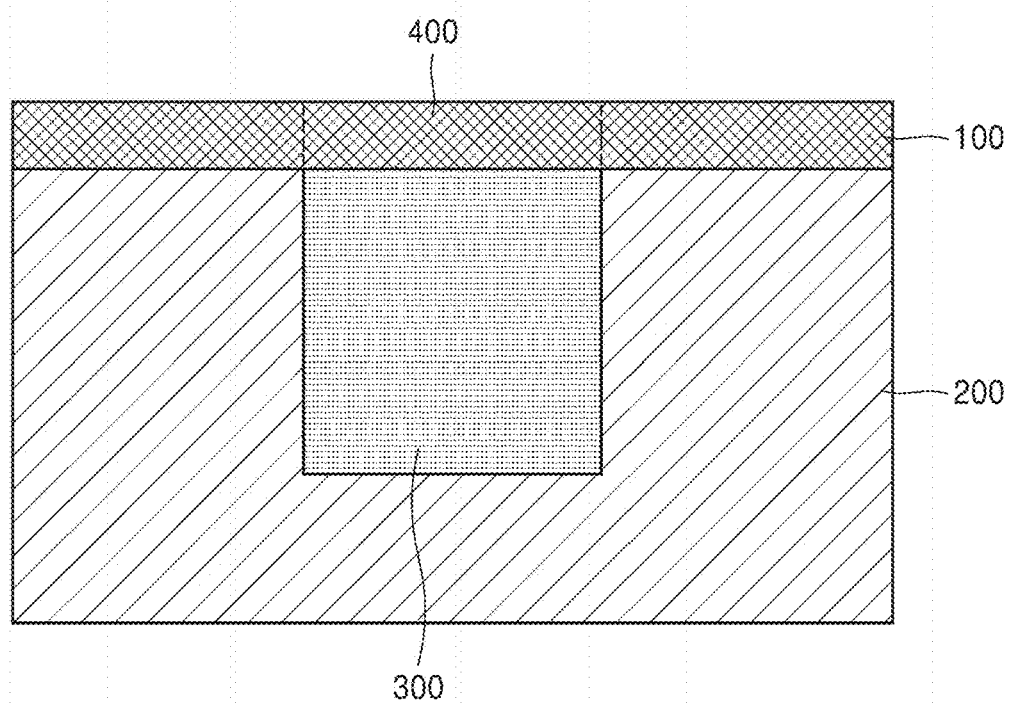
FIG. 9 is a cross-sectional view of the interconnect structure illustrated in FIG. 8, taken along line B-B'.
Figure 10:
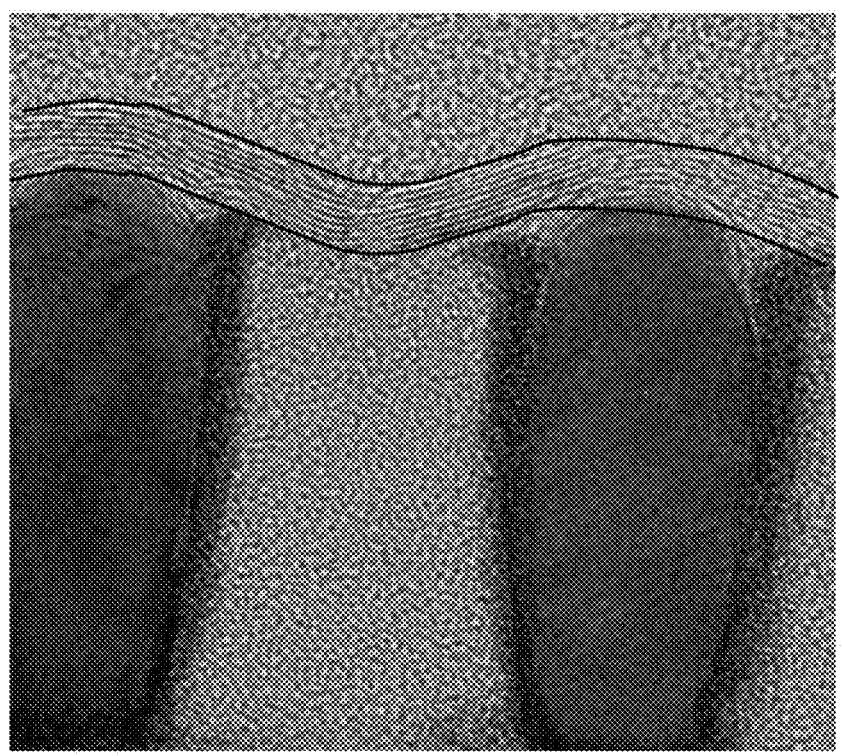
FIG. 10 is a TEM image of an interconnect structure according to an embodiment.
Figure 11A:
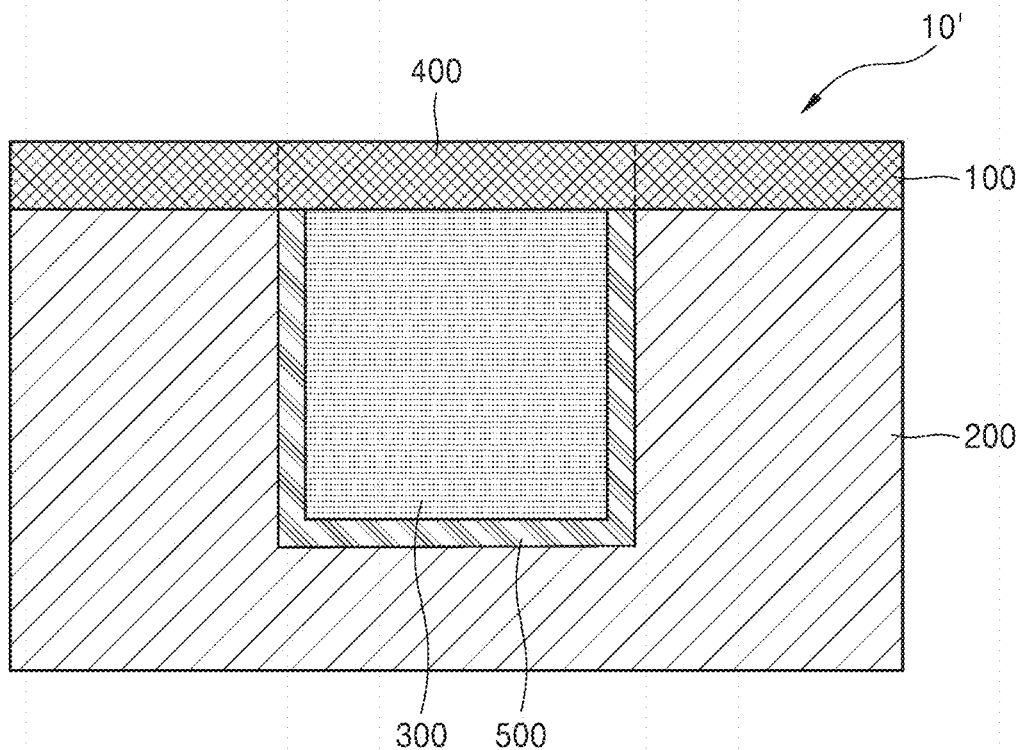
FIG. 11A is a cross-sectional view of an interconnect structure according to another embodiment.
Figure 11B:
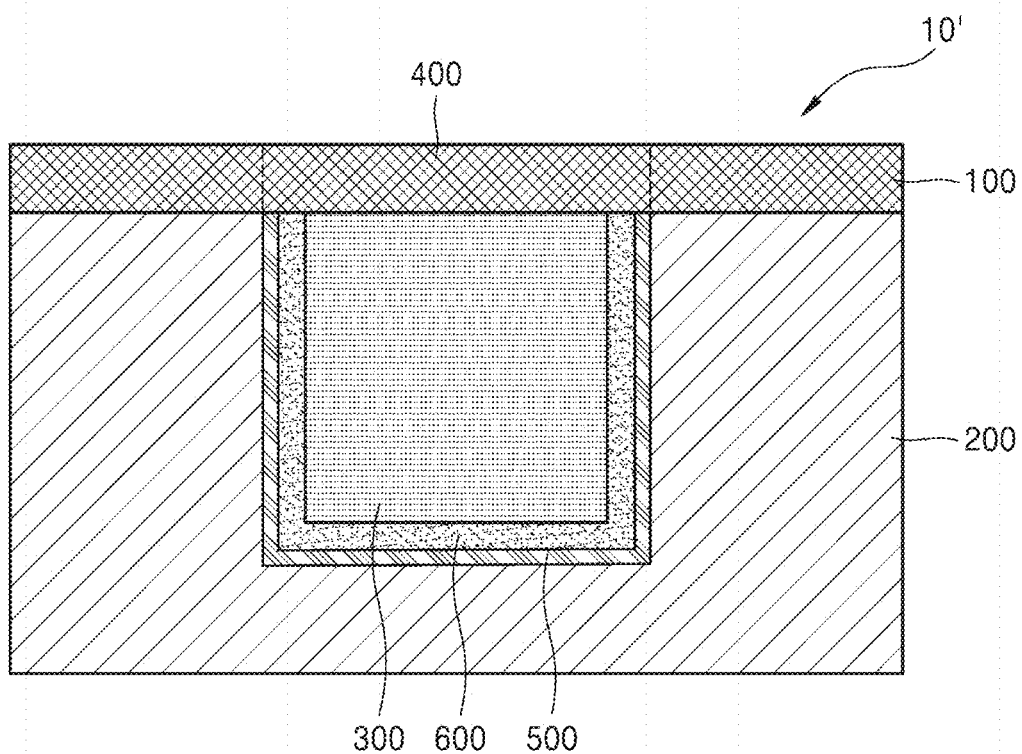
FIG. 11B is a cross-sectional view of an interconnect structure according to another embodiment.

FIG. 8 is a perspective view of an interconnect structure 10' according to an embodiment. FIG. 9 is a cross-sectional view of the interconnect structure 10' illustrated in FIG. 8, taken along line B-B'. FIG. 10 is a TEM image of an interconnect structure according to an embodiment. FIG. 11A is a cross-sectional view of the interconnect structure 10' according to another embodiment. FIG. 11B is a cross-sectional view of the interconnect structure 10' according to another embodiment.

Referring to FIGS. 8 and 9, the interconnect structure 10' according to an embodiment may include the graphene layer 100 on the dielectric layer 200, the dielectric layer 200 on side surfaces of the conductive wiring 300, the conductive wiring 300 having a certain pattern, and the capping layer 400 on the conductive wiring 300. The other components than the capping layer 400 are substantially the same as those illustrated in FIGS. 1 and 2, and thus descriptions thereof will be omitted for convenience of description.

The capping layer 400 according to an embodiment may include the same material as that of the graphene layer 100. For example, the capping layer 400 may include a graphene material in the same manner as the graphene layer 100. In this case, the capping layer 400 may be integrally formed with the graphene layer 100, on the conductive wiring 300.

Referring to FIG. 11A, the interconnect structure 10' according to an embodiment may further include the barrier layer 500 between the dielectric layer 200 and the conductive wiring 300. Referring to FIG. 11B, the interconnect structure 10' according to an embodiment may further include the liner layer 600 between the conductive wiring 300 and the barrier layer 500. The other components than the capping layer 400 are substantially the same as those illustrated in FIGS. 7A and 7B, and thus descriptions thereof will be omitted for convenience of description.

Figure 12:
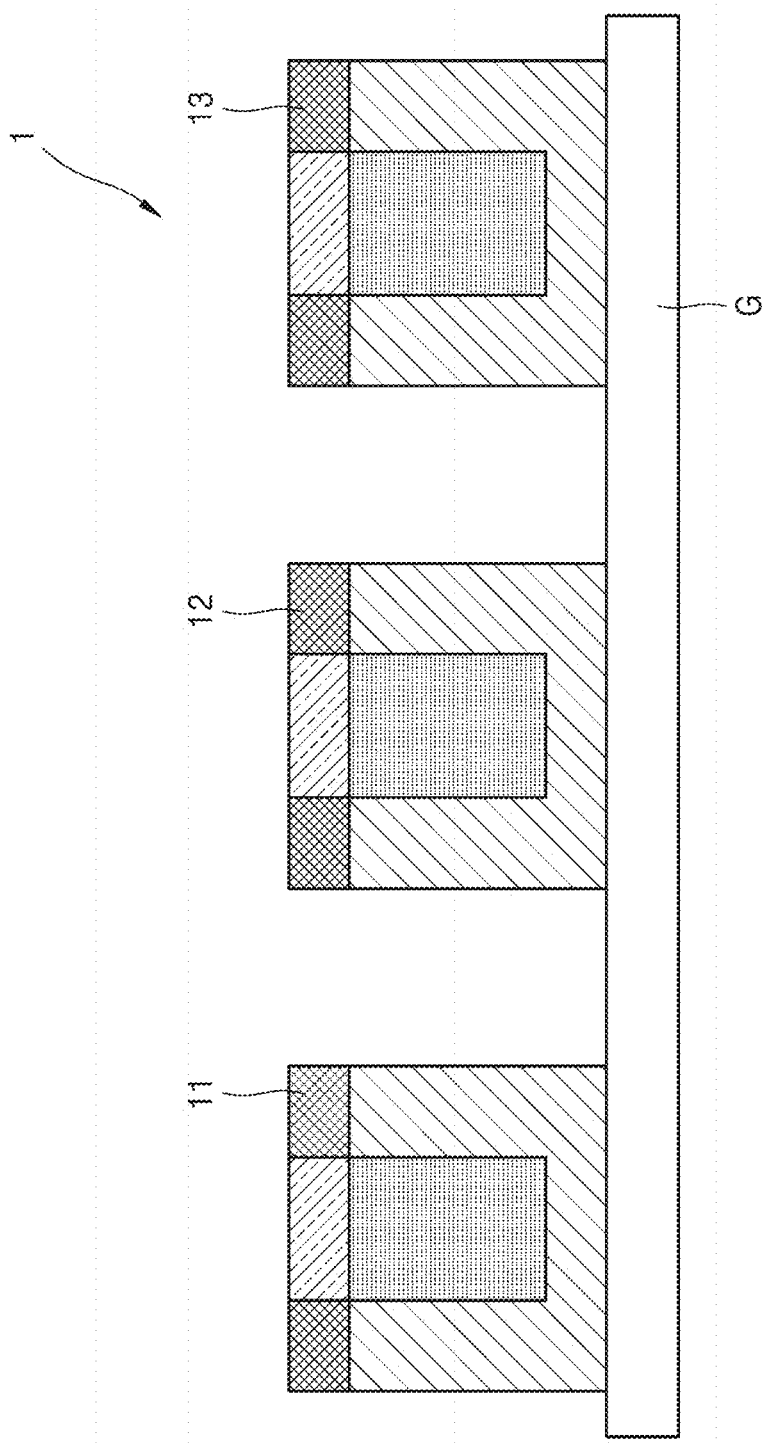
FIG. 12 is a schematic diagram of an electronic device according to an embodiment.

FIG. 12 is a schematic diagram of an electronic device 1 according to an embodiment.

Referring to FIG. 12, the electronic device 1 according to an embodiment may include a substrate G extending along one plane, and one or more interconnect structures 11 to 13 on the substrate G. The substrate G according to an embodiment may include at least one of a group IV semiconductor material, a semiconductor compound, an insulating material, and a metal. For example, the substrate G may include a group IV semiconductor material such as Si, Ge, or Sn. As another example, the substrate G may include at least one of Si, Ge, C, Zn, Cd, Al, Ga, In, B, C, N, P, S, Se, As, Sb, Te Ta, Ru, Rh, Ir, Co, Ta, Ti, W, Pt, Au, Ni, and Fe. For example, the substrate G may include Si, Ge, SiC, SiGe, SiGeC, a Ge alloy, GaAs, InAs, InP, or the like. The substrate G may include a single layer or a plurality of layers in which different materials are stacked.

For example, the substrate G may include a silicon-on-insulator (SOI) substrate or a silicon germanium-on-insulator (SGOI) substrate. For example, the substrate G may further include N and F as a SiCOH-based composition, and may include pores to lower the dielectric constant. Meanwhile, the substrate G may further include a dopant.

The substrate G may include at least one semiconductor device (not shown). For example, the semiconductor device may include at least one of a transistor, a capacitor, a diode, and a resistor. For example, the semiconductor device may be a transistor. However, the present disclosure is not limited thereto, and any semiconductor device that may be used in the art may be used.

Figure 13A:
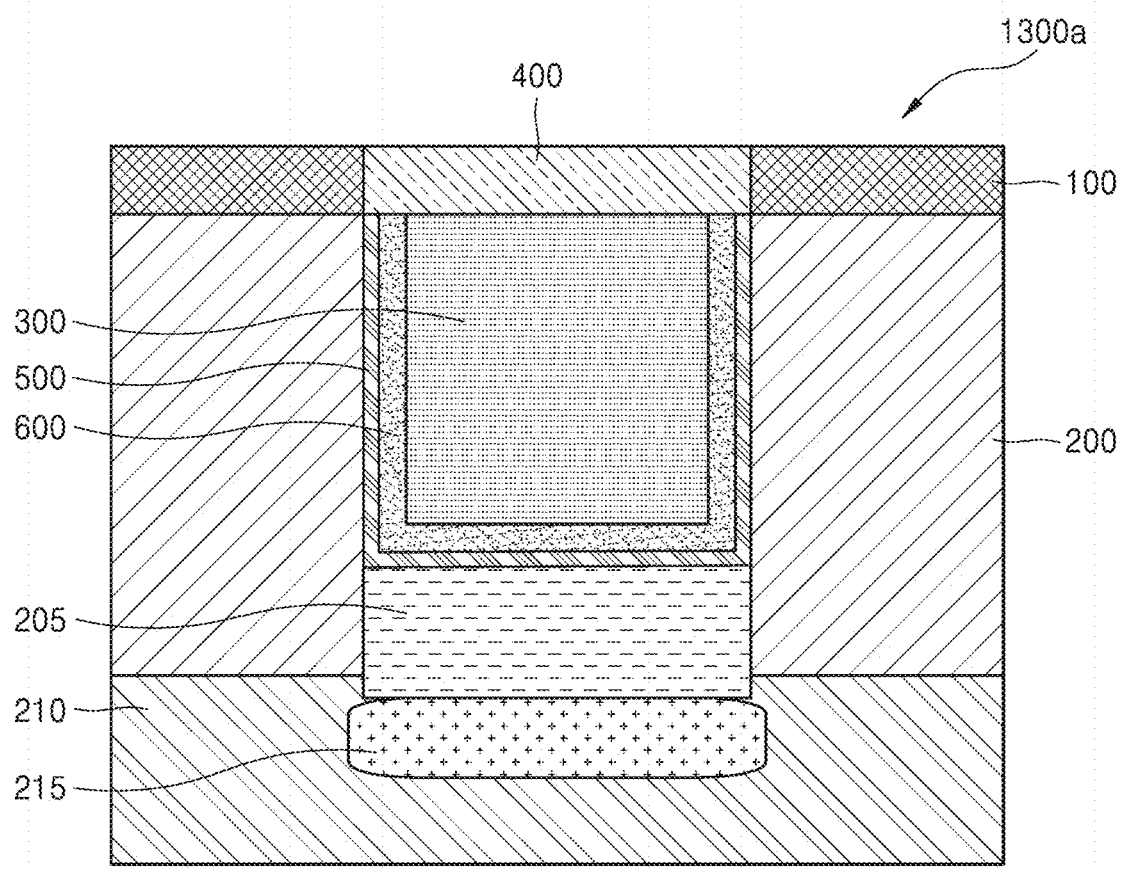
FIGS. 13A and 13B are cross-sectional views of electronic devices including interconnect structures according to example embodiments.
Figure 13B:
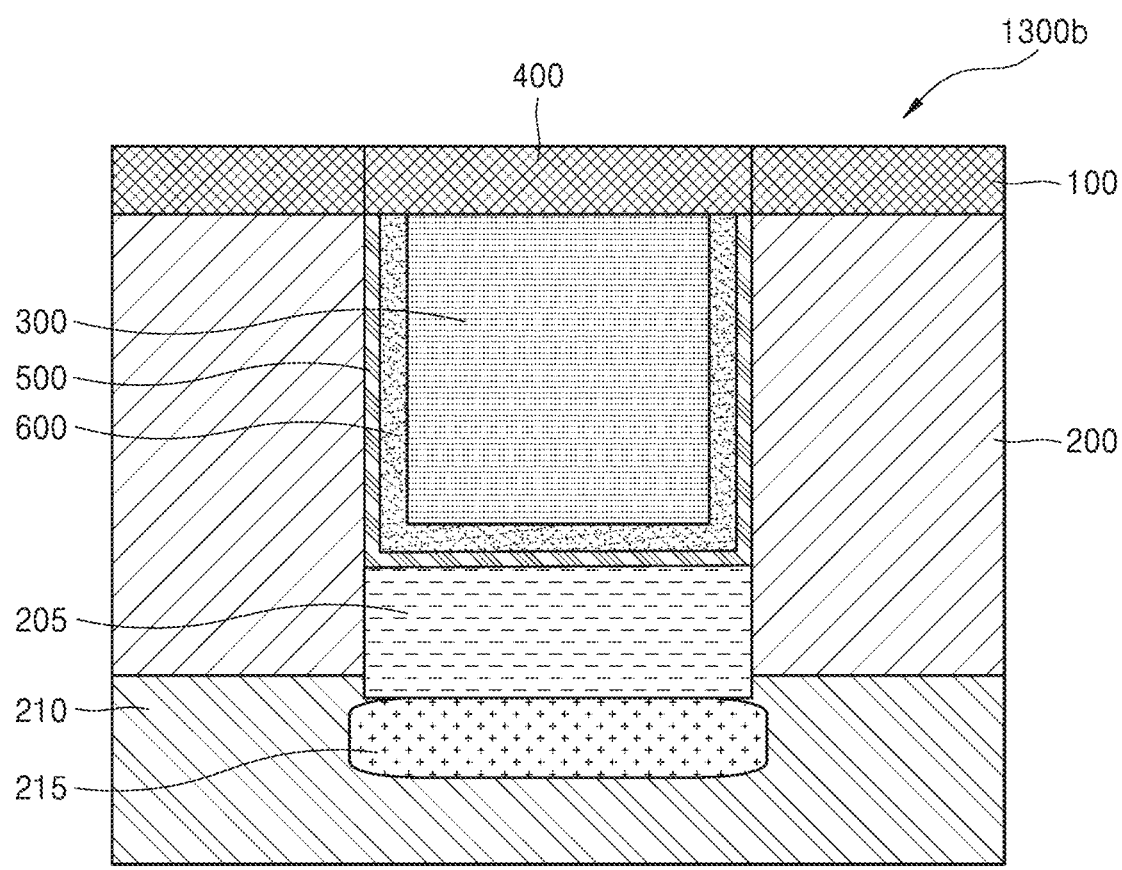

FIGS. 13A and 13B are cross-sectional views of electronic devices including interconnect structures according to example embodiments.

Referring to FIG. 13A, an electronic device 1300a may include a device portion 210 having a semiconductor region 215, and an element layer 205 on the semiconductor region 215. The device portion 210 and semiconductor region 215 may be part of a circuit (e.g., logic circuit, memory circuit, image sensor circuit). The dielectric layer 200 may cover the device portion 210 and surround the element layer 205. The dielectric layer 200 may define a hole or trench that exposes the semiconductor region 215 and element layer 205. The conductive wiring 300 may be in the hole or trench and may be electrically connected to the element layer 205.

A barrier layer 500 may be in the hole or trench of the dielectric layer 200 between the conductive wiring 300 and the dielectric layer 200. The barrier layer 500 may further extend between the conductive wiring 300 and the element layer 205. A liner layer 600 may be in the hole or trench of the dielectric layer 200 and may be between the conductive wiring 300 and the barrier layer 500. In some embodiments, the barrier layer 500 and/or liner layer 600 may be omitted. A graphene layer 100 may be formed on the dielectric layer 200 and define an opening over the hole or trench in which the conductive wiring 300 is disposed. A capping layer 400 may formed on the conductive wiring 300 and may be positioned in the opening defined by the graphene layer 100.

In FIG. 13A, the capping layer 400 may be a different material than the graphene layer 100. Alternatively, as shown in FIG. 13B, an electronic device 1300b may be the same as the electronic device 1300a in FIG. 13A, except the capping layer 400 of the electronic device 1300b may include the same material as a graphene layer 100.

An aspect of embodiments of inventive concepts provides an interconnect structure, in which a graphene layer has hydrophobic surface characteristics is on a dielectric layer and is capable of limiting and/or preventing impurities from permeating the dielectric layer so as to limit and/or prevent an increase in the dielectric constant of the dielectric layer.

Another aspect of embodiments of inventive concepts provides an interconnect structure including a capping layer capable of reducing the resistance of a conductive wiring, so as to limit and/or prevent deterioration of electrical characteristics.

Still another aspect provides is an electronic device including the interconnect structure described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. An interconnect structure comprising:
a conductive wiring having a certain pattern;
a dielectric layer on side surfaces of the conductive wiring;
a capping layer on the conductive wiring; and
a graphene layer on the dielectric layer, wherein
the graphene layer comprises a graphene material, and
a ratio of carbons having sp$^3$ bonds to carbons having sp$^2$ bonds in the graphene material is 1 or less,
wherein the capping layer and the graphene layer comprise different materials,
wherein the graphene layer is on an upper surface of the dielectric layer and defines an opening over an upper surface of the conductive wiring, and
wherein the capping layer is on the upper surface of the conductive wiring and in the opening defined by the graphene layer, such that the graphene layer surrounds sidewalls of the capping layer.

2. The interconnect structure of claim 1,
wherein the graphene layer has a contact angle of about 80° to about 110°.

3. The interconnect structure of claim 1,
wherein a lower surface of the graphene layer, the upper surface of the conductive wiring, and a lower surface of the capping layer are coplanar.

4. The interconnect structure of claim 1,
wherein the graphene layer comprises about 1 atomic % to about 20 atomic % hydrogen.

5. The interconnect structure of claim 1,
wherein the graphene layer further comprises one or more of F, Cl, Br, and N, and
a content of the one or more of F, Cl, Br, and N is in a range of about 1 atomic % to about 20 atomic %.

6. The interconnect structure of claim 1,
wherein an intensity ratio of a D-band peak to a G-band peak in a Raman spectrum of the graphene layer is 3.5 or less.

7. The interconnect structure of claim 1,
wherein an intensity ratio of a 2D-band peak to a G-band peak in a Raman spectrum of the graphene layer is 0.2 or greater.

8. The interconnect structure of claim 1,
wherein an average grain size of the graphene material is about 0.5 nm to about 100 nm.

9. The interconnect structure of claim 1,
wherein a thickness of the graphene layer is about 1 nm to about 20 nm.

10. The interconnect structure of claim 1,
wherein a density of the graphene layer is about 1.6 g/cc to about 2.1 g/cc.

11. The interconnect structure of claim 1,
wherein the conductive wiring comprises one or more of Cu, Ru, Rh, Ir, Mo, W, Pd, Pt, Co, Ta, and Ti, or an alloy thereof, or a subcombination thereof, or a combination thereof.

12. The interconnect structure of claim 1, further comprising:
a barrier layer between the dielectric layer and the conductive wiring.

13. The interconnect structure of claim 12, further comprising:
a liner layer between the conductive wiring and the barrier layer.

14. The interconnect structure of claim 1, wherein
the upper surface of the dielectric layer and the upper surface of the conductive wiring are coplanar.

15. An electronic device comprising:
a substrate; and
an interconnect structure on the substrate, wherein
the interconnect structure comprises a conductive wiring having a certain pattern, a dielectric layer on side surfaces of the conductive wiring, a capping layer on the conductive wiring, and a graphene layer on the dielectric layer, wherein
the graphene layer comprises a graphene material,
a ratio of carbons having sp3 bonds to carbons having sp2 bonds in the graphene material is 1 or less
wherein the capping layer and the graphene layer comprise different materials,
wherein the graphene layer is on an upper surface of the dielectric layer and defines an opening over an upper surface of the conductive wiring, and
wherein the capping layer is on the upper surface of the conductive wiring and in the opening defined by the graphene layer, such that the graphene layer surrounds sidewalls of the capping layer.

16. The electronic device of claim 15,
wherein the graphene layer has a contact angle of about 80° to about 110°.

17. The electronic device of claim 15,
wherein a lower surface of the graphene layer, the upper surface of the conductive wiring, and a lower surface of the capping layer are coplanar.

18. The electronic device of claim 15,
wherein the graphene layer comprises about 1 atomic % to about 20 atomic % hydrogen.

19. The electronic device of claim 15,
wherein the graphene layer further comprises one or more of F, Cl, Br, and N, and
a content of the one or more of F, Cl, Br, and N is in a range of about 1 atomic % to about 20 atomic %.

20. The electronic device of claim 15,
wherein an intensity ratio of a D-band peak to a G-band peak in a Raman spectrum of the graphene layer is 3.5 or less.

21. The electronic device of claim 15,
wherein an intensity ratio of a 2D-band peak to a G-band peak in a Raman spectrum of the graphene layer is 0.2 or greater.

22. The electronic device of claim 15, wherein
the upper surface of the dielectric layer and the upper surface of the conductive wiring are coplanar.

\* \* \* \* \*